United States Patent
Friesem et al.

(10) Patent No.: US 6,215,928 B1
(45) Date of Patent: Apr. 10, 2001

(54) ACTIVE WAVELENGTH SELECTION WITH RESONANT DEVICES

(75) Inventors: Asher A. Friesem, Rehovot; Avner Zvi Sharon, Tel-Aviv, both of (IL)

(73) Assignee: Yeda Research and Development Co. Ltd., Rehovot (IL)

( * ) Notice: Subject to any disclaimer, the term of this patent is extended or adjusted under 35 U.S.C. 154(b) by 0 days.

(21) Appl. No.: 09/180,201

(22) PCT Filed: May 7, 1997

(86) PCT No.: PCT/IL97/00151

§ 371 Date: Oct. 25, 1999

§ 102(e) Date: Oct. 25, 1999

(87) PCT Pub. No.: WO97/44686

PCT Pub. Date: Nov. 27, 1997

(30) Foreign Application Priority Data

May 19, 1996 (IL) ........................................... 118209

(51) Int. Cl.[7] ............................. G02B 6/34; H01S 3/086
(52) U.S. Cl. ............................. 385/37; 372/20; 372/102; 385/27; 385/40; 385/129
(58) Field of Search ............................. 385/2, 3, 8–10, 385/15, 27, 37, 39, 40, 129, 130, 131; 372/20, 23, 96, 102

(56) References Cited

U.S. PATENT DOCUMENTS

| 4,251,137 | 2/1981 | Knop et al. ........................ 349/201 |
| 4,658,403 | * 4/1987 | Takiguchi et al. ..................... 372/96 |
| 5,157,537 | 10/1992 | Rosenblatt ........................... 359/245 |
| 5,253,314 | 10/1993 | Alferness et al. ..................... 385/40 |
| 5,337,183 | 8/1994 | Rosenblatt ........................... 359/248 |
| 5,412,743 | * 5/1995 | Brazas, Jr. ............................ 385/2 |
| 5,598,300 | * 1/1997 | Magnusson et al. ............... 385/37 X |
| 6,035,089 | * 3/2000 | Grann et al. ......................... 385/129 |
| 6,041,071 | * 3/2000 | Tayebati ............................ 372/20 X |

FOREIGN PATENT DOCUMENTS

WO 93 01510   1/1993  (WO).

OTHER PUBLICATIONS

Delorme, F. et al, "Butt–Joined DBR Laser with 15 NM Tunability Grown in Three MOVPE Steps", *Electronic Letters*, GB, IEE Stevenage, vol. 31, No. 15, Jul. 20, 1995, pp. 1244–1245, XP000525768.

Bryan–Brown. G.P. et al., "Grating Coupled Liquid Crystal Waveguides Using Nematics and Smetics", *J. of Applied Physics*, vol. 73, No. 8, Apr. 15, 1993, pp. 3603–3607.

\* cited by examiner

*Primary Examiner*—John D. Lee
(74) *Attorney, Agent, or Firm*—Darby & Darby

(57) ABSTRACT

This invention discloses an electro-optically controlled optical element including a diffraction grating, and a planar waveguide associated with the diffraction grating, the diffraction grating and planar waveguide being configured to undergo resonance of at least one of transmitted or reflected light at a wavelength which is selectable by means of an electrical input.

44 Claims, 4 Drawing Sheets

ACTIVE WAVELENGTH SELECTION WITH RESONANT DEVICES

The present invention relates to electro-optically controlled optical elements generally and also to electro-optical assemblies including such elements.

Various types of electro-optically controlled optical elements are known in the art. U.S. Pat. Nos. 5,157,537 and 5,337,183 describe examples of such elements. The elements described in U.S. Pat. Nos. 5,157,537 and 5,337,183 have limited dynamic range and are thus proposed to be employed as optical modulators.

The present invention seeks to provide electro-optically controlled optical elements having a significantly greater dynamic range than is known from the prior art.

There is thus provided in accordance with a preferred embodiment of the present invention an electro-optically controlled optical element including a diffraction grating and a planar waveguide associated with the diffraction grating, the diffraction grating and planar waveguide being configured to undergo resonance of at least one of transmitted or reflected light at a wavelength which is selectable by means of an electrical input.

The planar waveguide may include multiple layers having differing indices of refraction.

The element may have at least one light transmissive surface generally parallel to the planar waveguide and including an anti-reflection coating formed on at least one light transmissive surface.

There is also provided in accordance with a preferred embodiment of the present invention a laser including a laser cavity, an active tunable mirror and an output coupler defining the laser cavity, and wherein the active tunable mirror includes an electro-optically controlled optical element including:

a diffraction grating; and a planar waveguide associated with the diffraction grating, the diffraction grating and planar waveguide being configured to undergo resonance of at least one of transmitted or reflected light at a wavelength which is selectable by means of an electrical input.

There is additionally provided in accordance with a preferred embodiment of the present invention an electro-optically tunable laser which is tunable over a dynamic range of more than 0.1 nanometer, preferably more than 1 nanometer and even more preferably several tens of nanometers.

The optical element may function as an electro-optical tunable filter.

In accordance with a preferred embodiment of the present invention, the electro-optically controlled optical element also includes a planar waveguide whose index of refraction is controlled by the electrical input.

Additionally or alternatively, the electro-optically controlled optical element also includes a light transmissive medium whose index of refraction is controlled by the electrical input. The light transmissive material may be a liquid crystal material.

In accordance with a preferred embodiment of the present invention, the electro-optically controlled optical element also includes transparent conductors arranged adjacent the planar waveguide and electro-optically connected via electrodes to the electrical input, the transparent conductors being operative to apply electrical energy across the planar waveguide.

Additionally or alternatively, the electro-optically controlled optical element also includes transparent conductors arranged adjacent the light transmissive medium and electro-optically connected via electrodes to the electrical input, the transparent conductors being operative to apply electrical energy across the light transmissive medium.

In accordance with one embodiment of the present invention, the diffraction grating and the planar waveguide are formed of semiconductor materials. Preferably, also includes a planar waveguide whose index of refraction is controlled by the electrical input and also including transparent conductors arranged adjacent the planar waveguide and electro-optically connected via electrodes to the electrical input, the transparent conductors being operative to apply electrical energy via suitably doped semiconductor material across the planar waveguide.

Additionally or alternatively, the element also includes a light transmissive medium whose index of refraction is controlled by the electrical input and transparent conductors arranged adjacent the light transmissive medium and electro-optically connected via electrodes to the electrical input, the transparent conductors being operative to apply electrical energy via suitably doped semiconductor material across the light transmissive medium.

In accordance with a preferred embodiment of the present invention, at least one of the diffraction grating and the planar waveguide are formed of an electro-optical material. Preferably, the planar waveguide has an index of refraction which is controlled by the electrical input and also including transparent conductors arranged adjacent the planar waveguide and electro-optically connected via electrodes to the electrical input, the transparent conductors being operative to apply electrical energy across the planar waveguide.

Alternatively or additionally, the element also includes a light transmissive medium whose index of refraction is controlled by the electrical input and transparent conductors arranged adjacent the light transmissive medium and electro-optically connected via electrodes to the electrical input, the transparent conductors being operative to apply electrical energy across the light transmissive medium.

In accordance with a preferred embodiment of the invention at least one of the diffraction grating and the planar waveguide are formed of a polymeric material having a range of selectable indices of refraction which is relatively wide.

Preferably, the planar waveguide has an index of refraction which is controlled by the electrical input and also including transparent conductors arranged adjacent the planar waveguide and electro-optically connected via electrodes to the electrical input, the transparent conductors being operative to apply electrical energy across the planar waveguide.

Alternatively or additionally, the element also includes a light transmissive medium whose index of refraction is controlled by the electrical input and transparent conductors arranged adjacent the light transmissive medium and electro-optically connected via electrodes to the electrical input, the transparent conductors being operative to apply electrical energy across the light transmissive medium.

The present invention will be understood and appreciated more fully from the following detailed description, taken in conjunction with the drawings in which.

Figure 4:
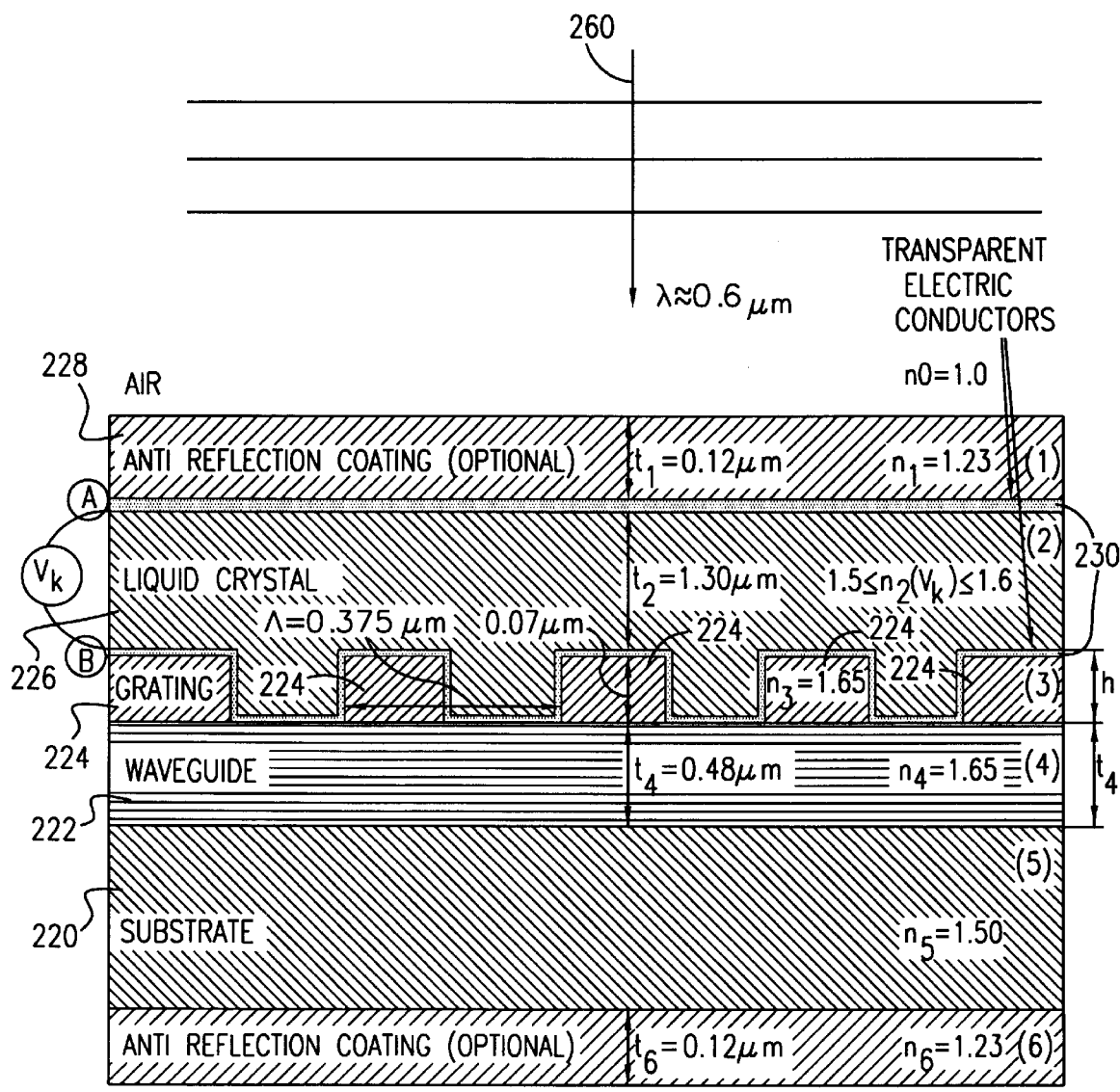
Figure 5:
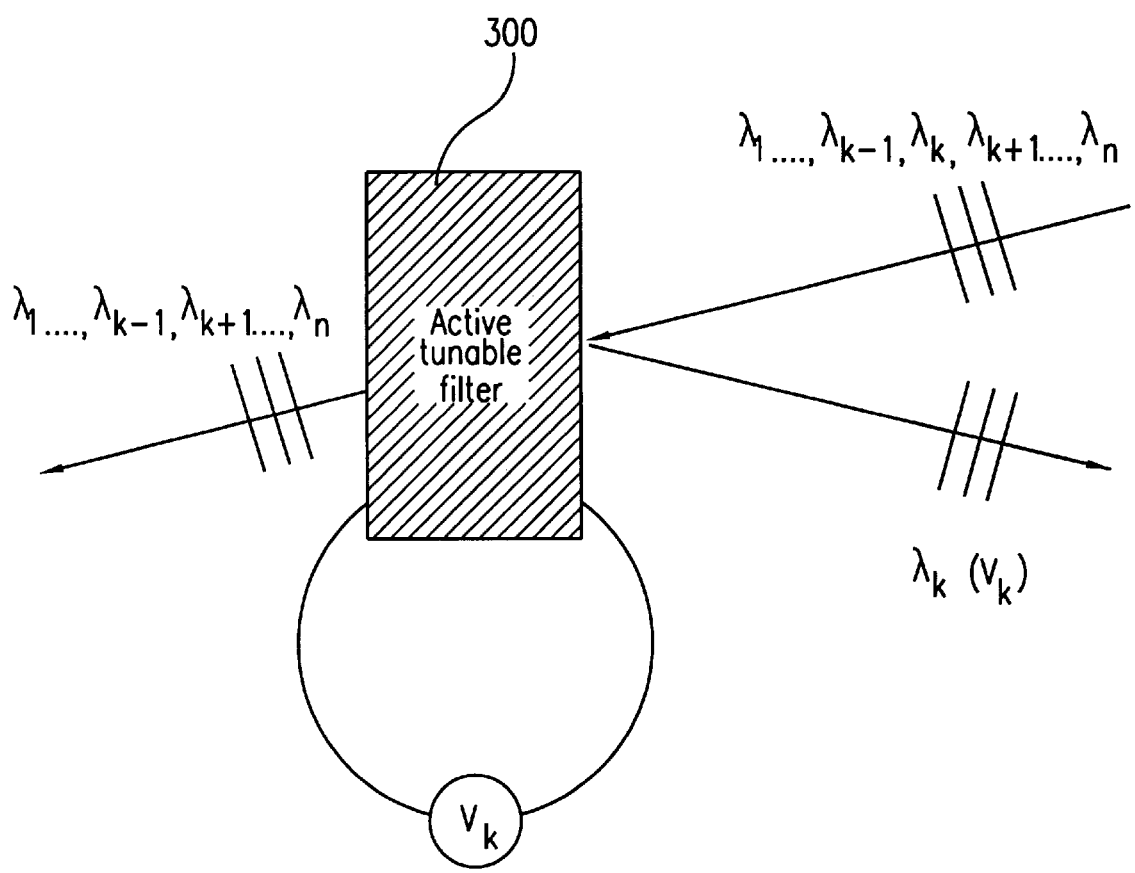

FIG. 4 is a simplified illustration of another preferred embodiment of an electro-optically controlled optical element constructed and operative in accordance with a preferred embodiment of the present invention employing liquid crystal material; and FIG. 5 is a simplified block diagram illustration of an active tunable filter constructed and operative in accordance with a preferred embodiment of the present invention.

Figure 1:
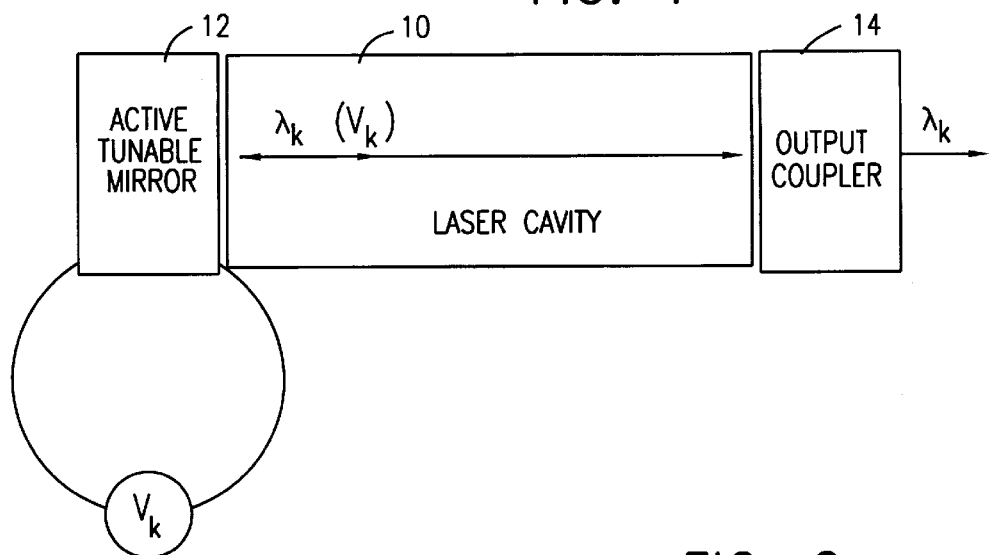
FIG. 1 is a simplified block diagram illustration of an electro-optically tunable laser constructed and operative in accordance with a preferred embodiment of the present invention.

Reference is now made to FIG. 1, which is a simplified block diagram illustration of an electro-optically tunable laser constructed and operative in accordance with a preferred embodiment of the present invention.

The laser of FIG. 1 preferably includes a laser cavity 10 having a tunable lasing spectrum. The laser cavity is defined at one end thereof by an electrically controllable active tunable mirror 12, which is preferably a resonant grating waveguide device constructed and operative in accordance with a preferred embodiment of the present invention. The opposite end of laser cavity 10 is preferably defined by an output coupler 14, such as a laser mirror, The laser of FIG. 1 is operative to output a laser beam of wavelength ($\lambda_k$) in response to the supply of a corresponding voltage $V_k$ to the active tunable mirror 12.

Figure 2:
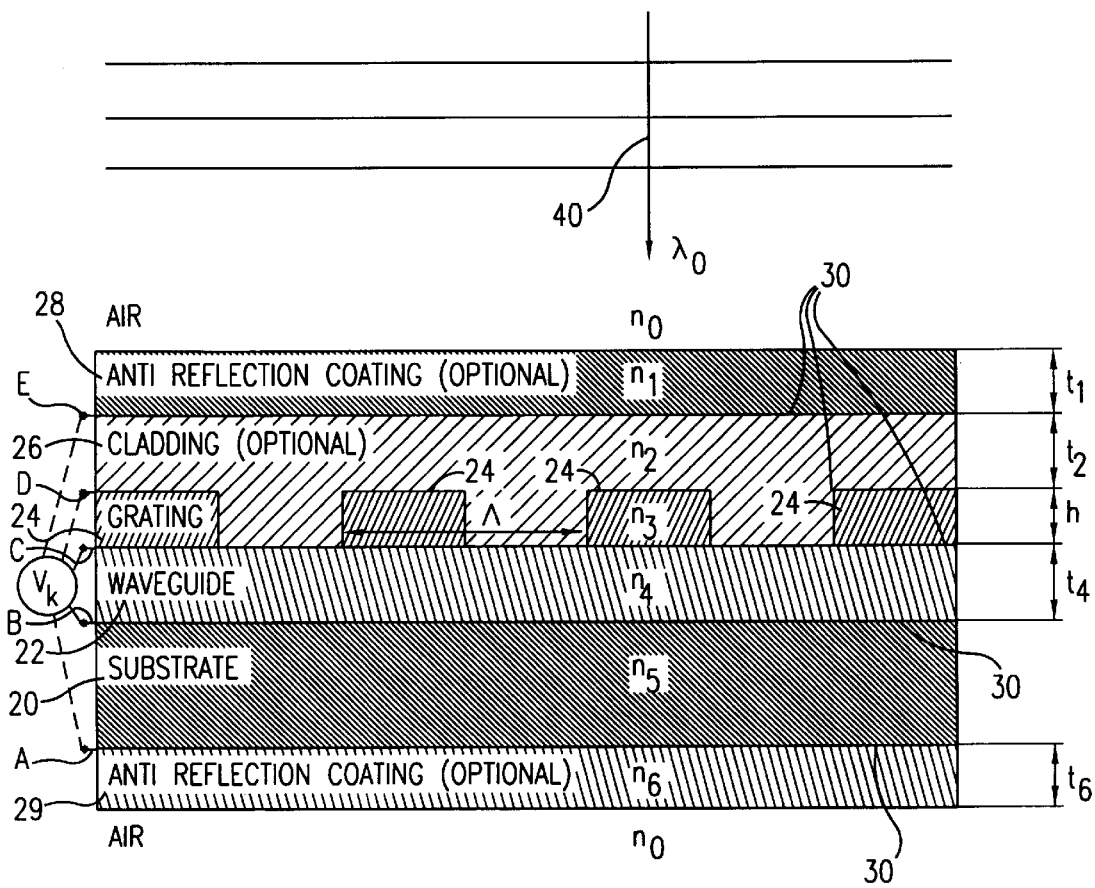
FIG. 2 is a simplified illustration of an electro-optically controlled optical element constructed and operative in accordance with a preferred embodiment of the present invention.

Reference is now made to FIG. 2, which is a simplified illustration of an electro-optically controlled optical element constructed and operative in accordance with a preferred embodiment of the present invention and which is particularly useful as an active tunable mirror, such as active tunable mirror 12 (FIG. 1). It is appreciated that the optical element of FIG. 2 has many other potential uses, such as an active tunable filter. As an active filter, the optical element reflects only a selected resonance wavelength from among many wavelengths impinging thereon.

The optical element of FIG. 2 comprises a substrate 20, which typically is formed of a dielectric, transparent crystal, polymer or semiconductor material. A waveguide 22 is formed onto the substrate 20. The waveguide may be a single or multiple layer waveguide and may be formed of any suitable material, such as, for example, a dielectric, transparent crystal, polymer, liquid crystal or semiconductor material.

In FIG. 2 and the other drawings of the present application, $n_0$ the refractive index of air and $n_i$ is the refractive index of the various layers of the electro-optically controlled optical element, where the index i defines the i-th layer of the device. Additionally, $t_i$ is the thickness of the i-th layer of the device, h is the height of the grating and $\Lambda$ is the period of the grating.

Waveguide 22 may be a single mode or multiple mode waveguide. It may operate on TE or TM polarization. Where a multiple mode waveguide is provided, one mode may operate on TE or TM polarization and the remaining mode or modes may operate on the other polarization. The optical element may operate at wavelengths extending from the far UV to the far IR. The structural parameters of the optical element are determined by the wavelength at which the optical element is sought to operate.

In accordance with a preferred embodiment of the present invention a diffraction grating 24 is formed over the waveguide 22. The diffraction grating 24 may be formed of the same material as the waveguide 22 or of another material and may be formed of any suitable material, such as, for example, a dielectric, transparent crystal, polymer or semiconductor material. Although the diffraction grating is shown to have a rectangular configuration, this need not necessarily be the case.

There may optionally be formed over the diffraction grating 24 a cladding layer 26 which at least fills the interstices of the diffraction grating 24. The cladding is formed of a material different from that of the diffraction grating and may be formed of any suitable material, such as, for example, a dielectric, transparent crystal, polymer or semiconductor material.

There may also optionally be formed over the cladding layer 26 an anti-reflection coating 28. The anti-reflection coating may be a single or multiple layer coating and may be entirely conventional.

Additionally, on the opposite surface of substrate 20 from waveguide 22 there may optionally be formed an anti-reflection coating 29. The anti-reflection coating may be a single or multiple layer coating and may be entirely conventional.

In accordance with a preferred embodiment of the present invention, at least two transparent conductors 30 are provided intermediate selected layers of the optical element of FIG. 2.

For example, transparent conductors may be located at locations A and B, on opposite surfaces of the substrate. Alternatively, the transparent conductors may be located at locations A and C, location C being intermediate the waveguide 22 and the grating 24. As a further alternative, the transparent conductors may be located at locations A and D, location D being intermediate the grating 24 and the cladding 26. As still a further alternative, the transparent conductors may be located at locations A and E, location E being intermediate the cladding 26 and the optional anti-reflection coating 28.

As additional examples, transparent conductors may be located at locations B and C, B and D, and B and E or at location C and E.

A voltage or current source $V_k$ is coupled across the two transparent conductors.

An incident light beam 40, such as a plane wave, having a predetermined wavelength ($\lambda_0$) impinges on the optical element as indicated generally in FIG. 2. It is appreciated that it may impinge on the optical element from either side of the substrate. When the optical element of FIG. 2 is employed as a laser mirror, as, for example, in the embodiment of FIG. 1, the impingement is preferably substantially perpendicular to the surfaces of the substrate 20 and the waveguide 22. When the optical element of FIG. 2 is employed as a active tunable filter, the impingement is preferably non-perpendicular but lies within a predetermined angular limit of the perpendicular.

The operation of the optical element of FIG. 2 may be summarized as follows: Light of a predetermined wavelength impinging on the optical element at a predetermined angle is substantially reflected by the optical element, which is at resonance for this particular wavelength. Light of other than the predetermined wavelength or which impinges at other than the predetermined angle is mainly transmitted through the optical element in the direction of impingement. The spectral behavior at wavelengths near the predetermined wavelength and at angles near the predetermined angle is generally Lorentzian.

The spectral bandwidth, $\Delta\lambda$, of the optical element for transmission or reflection may be approximated as being proportionally related to the height of the diffraction grating and the difference between the refractive indices of the grating, $n_j$, and the cladding, $n_k$, by:

$$\Delta\lambda \, (n_j^2 - n_k^2)^a k^b . h^c$$

where k is the first Fourier component of the grating; and h is the height of the grating. The indices "a"; "b"; and "c", generally have the value of 2.

Thus, for a given laser or tunable filter structure, the spectral bandwidth can be selected to preferably be between the values of 0.01 nanometers to 1.0 nanometer. Usually, the height of the diffraction grating and the difference in the indices of refraction between the grating and the cladding are the variables which are conveniently selected to choose the desired spectral bandwidth.

The mechanism which produces the above-described behavior can be summarized as follows: Light impinging on the optical element is partially diffracted into a mode in the waveguide for travel therealong and is diffracted out of the waveguide at intermittent locations along the waveguide. At resonance, the sum of the light diffracted out of the waveguide into the incident beam direction is substantially equal to zero, while the sum of the light diffracted out of the waveguide in the zero order direction of reflection with respect to the incident beam direction is substantially equal to unity. Substantially total reflection of the incident beam results.

Away from resonance, the sum of the light diffracted out of the waveguide into the incident beam direction is substantially equal to unity less the usual Fresnel reflection, while the sum of the light diffracted out of the waveguide in the zero order direction of reflection with respect to the incident beam direction is substantially equal to the usual Fresnel reflection.

Thus, when the electro-optically controlled element is working as an active tunable mirror in a laser cavity, the lasing wavelength of the laser is determined by the active tunable mirror to be the resonance wavelength of the mirror. All other wavelengths suffer from strong losses due to their small amount of reflection, and thus do not lase.

When the electro-optically controlled element is working as an active tunable filter, only the light incident on the device at a wavelength which is the device resonant wavelength is selected by reflecting back from the device. All other incident wavelengths are generally transmitted through the device.

The resonant wavelength of the optical element of FIG. 2 and of the remaining optical elements described hereinbelow is selected by supplying to the optical element a suitably selected electrical voltage or current. The suitably selected voltage or current is operative to the index of refraction of one or more layers by means of, for example, the linear electro-optic effect (Pockels), the quadratic electro-optic effect, the plasma effect in semiconductors, the band-filling effect in semiconductors or current injection. The resonant wavelength may be shifted by varying the voltage or current supplied to the element.

Figure 3:
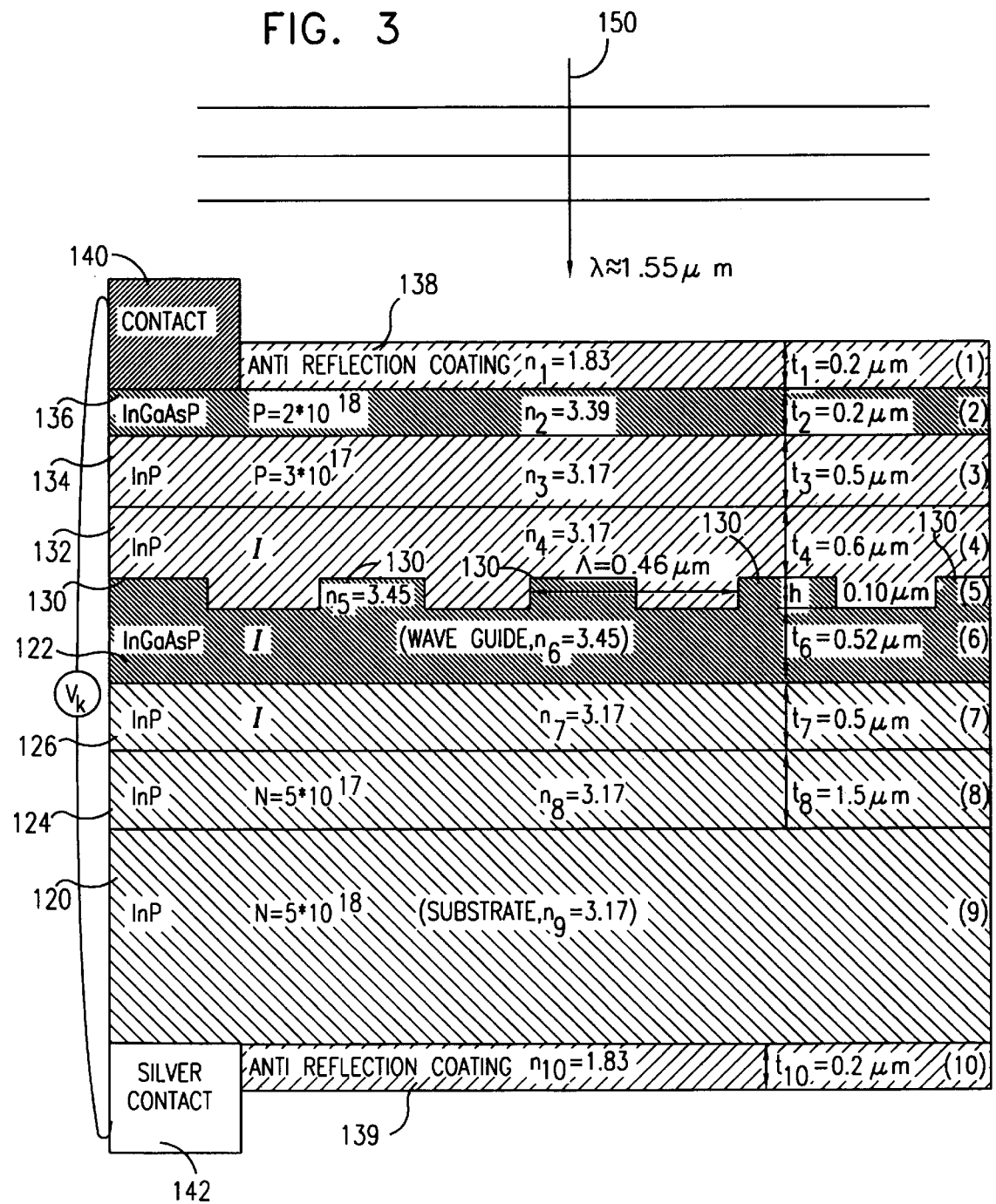
FIG. 3 is a simplified illustration of a preferred embodiment of an electro-optically controlled optical element constructed and operative in accordance with a preferred embodiment of the present invention employing semiconductor materials.

Reference is now made to FIG. 3, which is a simplified illustration of a preferred embodiment of an electro-optically controlled optical element constructed and operative in accordance with a preferred embodiment of the present invention employing semiconductor materials and which is particularly useful as an active tunable mirror, such as active tunable mirror 12 (FIG. 1). It is appreciated that the optical element of FIG. 3 has many other potential uses, such as a active tunable filter.

The optical element of FIG. 3 comprises a N- or P- doped substrate 120, which typically is formed of a semiconductor material such as gallium arsenide, indium phosphide, silicon or germanium. A waveguide 122 is formed over the substrate 120. The waveguide may be a single or multiple layer waveguide and may be formed of any suitable semiconductor material, such as, for example, aluminum gallium arsenide, indium gallium arsenide phosphide or silicon germanium. In FIG. 3 the symbol "I" indicates an "intrinsic layer". Usually "I" has doping values between $10^-$ to 10 and in some cases "I" may have values up to $10^{17}$.

FIG. 3 illustrates a P-I-N device. Alternatively, it is appreciated that the device of FIG. 3 may also be a N-I-P device by reversing its relevant layers.

In accordance with one embodiment of the invention there may be optionally provided one or more intermediate semiconductive layers. In the illustrated embodiment a first layer 124 is provided of a material identical or similar to that of substrate 120 but having a lesser amount of doping than the substrate 120. An additional layer 126 may be provided intermediate layer 124 and waveguide 122. Layer 126 is typically of a material identical or similar to that of substrate 120 and layer 124, but substantially without doping, that is an intrinsic layer "I". It is appreciated that additional layers of gradually lesser doping may be interposed between layers 124 and 126.

The gradual decrease in doping in successive layers between the substrate 120 and the waveguide 122 is intended to provide gradually increasing mode losses with increasing distance from the waveguide 122, thus decreasing the overall mode loss of the element.

The provision of layer 126, having substantially no doping, is intended to decrease the effective capacitance of the waveguide 122 and thus increase its operating speed.

In accordance with a preferred embodiment of the present invention a diffraction grating 130 is formed over the waveguide 122. In the illustrated embodiment of FIG. 3, the diffraction grating 130 is integrally formed with the waveguide 122, although this need not be the case. In a preferred embodiment of the invention, the diffraction grating 130 is formed of the same material as the waveguide 122, it being appreciated that the diffraction may be formed of another suitable semiconductor material. Although the diffraction grating is shown to have a rectangular configuration, this need not necessarily be the case.

There may optionally be formed over the diffraction grating 130 one or more cladding layers 132, 134 and 136, wherein cladding 132 at least fills the interstices of the diffraction grating 130. The cladding is formed of a material different from that of the diffraction grating and may be formed of any suitable semiconductor or other material, such as, for example, such as, for example, aluminum gallium arsenide, indium gallium arsenide phosphide, silicon germanium or transparent ITO.

In the illustrated embodiment, three cladding layers 132, 134 and 136 are provided. It is appreciated that a lesser or greater number of cladding layers may alternatively be provided, so long as at least one transparent electrode is present over the diffraction grating 130.

In the illustrated embodiment layer 134 is provided of a material identical or similar to that of layer 136 but having a lesser amount of doping. Layer 132, intermediate layer 134 and diffraction grating 130, is typically of a material identical or similar to that of layer 134, but substantially without doping. It is appreciated that additional layers of gradually lesser doping may be interposed between layers 134 and 132.

The gradual decrease in doping in successive layers between layer 136 and diffraction grating 130 is intended to provide gradually increasing mode losses with increasing distance from the waveguide 122, thus decreasing the overall mode loss of the element.

The provision of layer 132, having substantially no doping, is intended to decrease the effective capacitance of the waveguide 122 and thus increase its operating speed.

There may also optionally be formed over cladding layer 136 an anti-reflection coating 138. The anti-reflection coating may be a single or multiple layer coating and may be entirely conventional.

Additionally, on the opposite surface of substrate 120 from waveguide 122 there may optionally be formed an anti-reflection coating 139. The anti-reflection coating may be a single or multiple layer coating and may be entirely conventional.

In the illustrated embodiment, a conductor 140, typically formed of a metal or semiconductor material, is electrically associated with layer 136 and a conductor 142, also typically formed of a metal or semiconductor material, is electrically associated with the substrate 120.

Alternatively, at least two transparent conductors (not shown) may be provided intermediate selected layers of the optical element.

A voltage or current source $V_k$ is coupled across the two conductors 140 and 142.

The device optical and geometrical parameters illustrated in FIG. 3 allow the device to function as an active tunable mirror or as an active tunable filter for wavelengths in the region of 1.55 microns.

An incident light beam 150 having a predetermined wavelength ($\lambda_0 \approx 1.55$ microns) impinges on the optical element as indicated generally in FIG. 3. It is appreciated that it may impinge on the optical element from either side of the substrate. When the optical element of FIG. 3 is employed as a laser mirror, as, for example, in the embodiment of FIG. 1, the impingement is preferably substantially perpendicular to the surfaces of the substrate 120 and the waveguide 122. When the optical element of FIG. 3 is employed as a active tunable filter, the impingement is preferably non-perpendicular but lies within a predetermined angular limit of the perpendicular.

It will be appreciated that in the illustration of FIG. 3 the indices of refraction ($n_6$=3.45) of the waveguide and the grating (layer 5) and ($n_4$=3.17) of the layer 4 above the grating, as well as the duty cycle of the grating and the grating height are selected to provide a spectral bandwidth, at full width half maximum of the Lorentzian of about 0.25 nm.

The operation of the optical element of FIG. 3 may be identical to that summarized hereinabove with reference to FIG. 2.

Reference is now made to FIG. 4 which is a simplified illustration of another preferred embodiment of an electro-optically controlled optical element constructed and operative in accordance with a preferred embodiment of the present invention employing liquid crystal material and which is particularly useful as an active tunable mirror, such as active tunable mirror 12 (FIG. 1). It is appreciated that the optical element of FIG. 4 has many other potential uses, such as a active tunable filter.

The optical element of FIG. 4 comprises a substrate 220, which typically is formed of a dielectric, transparent crystal, polymer or semiconductor material. A waveguide 222 is formed onto the substrate 220. The waveguide may be a single or multiple layer waveguide and may be formed of any suitable material, such as, for example, a dielectric, transparent crystal, polymer or semiconductor material.

In accordance with a preferred embodiment of the present invention a diffraction grating 224 is formed over the waveguide 222. The diffraction grating 224 may be formed of the same material as the waveguide 222 or of another material and may be formed of any suitable material, such as, for example, a dielectric, transparent crystal, polymer or semiconductor material. Although the diffraction grating is shown to have a rectangular configuration, this need not necessarily be the case.

There is formed over the diffraction grating 224 a cladding layer 226 which at least fills the interstices of the diffraction grating 224. The cladding is formed of a liquid crystal material having a wide range of selectable indices of refraction.

There may also optionally be formed over the cladding layer 226 an anti-reflection coating 228. The anti-reflection coating may be a single or multiple layer coating and may be entirely conventional.

Additionally, on the opposite surface of substrate 220 from waveguide 222 there may optionally be formed an anti-reflection coating 229. The anti-reflection coating may be a single or multiple layer coating and may be entirely conventional.

In accordance with a preferred embodiment of the present invention, at least two transparent conductors 230 are provided intermediate selected layers of the optical element of FIG. 4.

In the illustrated embodiment transparent conductors are seen to be located at locations A and B, on opposite surfaces of the liquid crystal cladding layer 226. A voltage or current source $V_k$ is coupled across the two transparent conductors.

The device optical and geometrical parameters illustrated in FIG. 4 allow the device to function as an active tunable mirror or as an active tunable filter for wavelengths in the region of 0.6 microns.

An incident light beam 260 having a predetermined wavelength ($\lambda_0 \approx 0.6$ microns) impinges on the optical element as indicated generally in FIG. 4. It is appreciated that it may impinge on the optical element from either side of the substrate. When the optical element of FIG. 4 is employed as a laser mirror, as, for example, in the embodiment of FIG. 1, the impingement is preferably substantially perpendicular to the surfaces of the substrate 220 and the waveguide 222. When the optical element of FIG. 4 is employed as a active tunable filter, the impingement is preferably non-perpendicular but lies within a predetermined angular limit of the perpendicular.

The operation of the optical element of FIG. 4 may identical to that summarized hereinabove with respect to FIG. 2. It will be appreciated that in the illustration of FIG. 4 the indices of refraction ($n_4$=1.65) of the grating and ($n_2$ preferably about 1.5) of the layer above the grating as well as the duty cycle of the grating and the grating height are selected to provide a spectral bandwidth, at fill width half maximum of the Lorentzian of about 0.1 nm.

Reference is now made to FIG. 5 which illustrates the optical element of any of FIGS. 2, 3 and 4 in operation as a active tunable filter. Radiation at various wavelengths ($\lambda_1, \ldots ; \lambda_n$) impinges upon the optical element 300. Depending on the voltage or current $V_k$ applied to the optical element 300, the optical element reflects radiation only at a given wavelength($\lambda_k$). Radiation at all other wavelengths passes through the optical element.

It will be appreciated by persons skilled in the art that the present invention is not limited by what has been particularly shown and described hereinabove. Rather the scope of the present invention is defined only by the claims which follow:

We claim:

1. An electro-optically controlled optical element, comprising:
   a diffraction grating; and
   a planar waveguide associated with said diffraction grating, said diffraction grating and said planar waveguide constituting a resonant structure, tunable to a preselected wavelength of light by means of an electrical input.

2. An electro-optically controlled optical element according to claim 1 and also comprising a light transmissive medium whose index of refraction is controlled by said electrical input.

3. An electro-optically controlled optical element according to claim 2 and also comprising transparent conductors arranged adjacent said light transmissive medium and electro-optically connected via electrodes to said electrical input, said transparent conductors being operative to apply electrical energy across said light transmissive medium.

4. An electro-optically controlled optical element according to claim 2 and wherein said light transmissive medium is a liquid crystal material.

5. An electro-optically controlled optical element according to claim 4 and wherein said light transmissive medium has an index of refraction which is controlled by said electrical input and said optical element also comprises transparent conductors arranged adjacent said light transmissive medium and electro-optically connected via electrodes to said electrical input, said transparent conductors being operative to apply electrical energy across said light transmissive medium.

6. An electro-optically controlled optical element according to claim 1 and wherein said planar waveguide has an index of refraction which is controlled by said electrical input.

7. An electro-optically controlled optical element according to claim 6 and also comprising transparent conductors arranged adjacent said planar waveguide and electro-optically connected via electrodes to said electrical input, said transparent conductors being operative to apply electrical energy across said planar waveguide.

8. An electro-optically controlled optical element according to claim 1 and wherein said diffraction grating and said planar waveguide are formed of semiconductor materials.

9. An electro-optically controlled optical element according to claim 8 and also comprising a light transmissive medium whose index of refraction is controlled by said electrical input and transparent conductors arranged adjacent said light transmissive medium and electro-optically connected via electrodes to said electrical input, said transparent conductors being operative to apply electrical energy via suitably doped semiconductor material across said light transmissive medium.

10. An electro-optically controlled optical element according to claim 8 wherein said planar waveguide has an index of refraction which is controlled by said electrical input and also comprising transparent conductors arranged adjacent said planar waveguide and electro-optically connected via electrodes to said electrical input, said transparent conductors being operative to apply electrical energy via suitably doped semiconductor material across said planar waveguide.

11. An electro-optically controlled optical element according to claim 1 and wherein at least one of said diffraction grating and said planar waveguide are formed of an electro-optical material.

12. An electro-optically controlled optical element according to claim 11 and also comprising a light transmissive medium whose index of refraction is controlled by said electrical input and transparent conductors arranged adjacent said light transmissive medium and electro-optically connected via electrodes to said electrical input, said transparent conductors being operative to apply electrical energy across said light transmissive medium.

13. An electro-optically controlled optical element according to claim 11 wherein said planar waveguide has an index of refraction which is controlled by said electrical input and also comprising transparent conductors arranged adjacent said planar waveguide and electro-optically connected via electrodes to said electrical input, said transparent conductors being operative to apply electrical energy across said planar waveguide.

14. An electro-optically controlled optical element according to claim 1 and wherein at least one of said diffraction grating and said planar waveguide are formed of at least one of a polymeric material and a liquid crystal.

15. An electro-optically controlled optical element according to claim 14 and also comprising a light transmissive medium whose index of refraction is controlled by said electrical input and transparent conductors arranged adjacent said light transmissive medium and electro-optically connected via electrodes to said electrical input, said transparent conductors being operative to apply electrical energy across said light transmissive medium.

16. An electro-optically controlled optical element according to claim 14 wherein said planar waveguide has an index of refraction which is controlled by said electrical input and also comprising transparent conductors arranged adjacent said planar waveguide and electro-optically connected via electrodes to said electrical input, said transparent conductors being operative to apply electrical energy across said planar waveguide.

17. An electro-optically controlled optical element according to claim 1 and wherein said planar waveguide comprises multiple layers having differing indices of refraction.

18. An electro-optically controlled optical element according to claim 1 and having at least one light transmissive surface generally parallel to said planar waveguide and comprising an anti-reflection coating formed on at least one light transmissive surface.

19. An electro-optically controlled optical element according to claim 1 and wherein said optical element is an electro-optical tunable filter.

20. An electro-optically controlled optical element according to claim 1 and wherein said optical element is a portion of a laser.

21. An electro-optically controlled optical element according to claim 1, and which is operative to transmit incident light essentially only at said preselected wavelength.

22. An electro-optically controlled optical element according to claim 1, and which is operative to reflect incident light essentially only at said preselected wavelength.

23. An electro-optically controlled optical element according to claim 1, and wherein said diffraction grating essentially covers the entire width of the element.

24. A laser comprising:
   a laser cavity; and
   an active tunable mirror and an output coupler defining said laser cavity, and wherein said active tunable mirror comprises an electro-optically controlled optical element comprising:
      a diffraction grating; and a planar waveguide associated with said diffraction grating, said diffraction grating and said planar waveguide constituting a resonant structure, tunable to a preselected wavelength of light by means of an electrical input.

25. A laser according to claim 24 and wherein said electro-optically controlled optical element also comprises a light transmissive medium whose index of refraction is controlled by said electrical input.

26. A laser according to claim 25 and wherein said electro-optically controlled optical element also comprises transparent conductors arranged adjacent said light transmissive medium and electro-optically connected via, electrodes to said electrical input, said transparent conductors being operative to apply electrical energy across said light transmissive medium.

27. A laser according to claim 24 and wherein said planar waveguide has an index of refraction which is controlled by said electrical input.

28. A laser according to claim 27 and wherein said electro-optically controlled optical element also comprises transparent conductors arranged adjacent said planar waveguide and electro-optically connected via electrodes to said electrical input, said transparent conductors being operative to apply electrical energy across said planar waveguide.

29. A laser according to claim 24 and wherein said diffraction grating and said planar waveguide are formed of semiconductor materials.

30. A laser according to claim 29 and wherein said electro-optically controlled optical element also comprises a light transmissive medium whose index of refraction is controlled by said electrical input and transparent conductors arranged adjacent said light transmissive medium and electro-optically connected via electrodes to said electrical input, said transparent conductors being operative to apply electrical energy via suitably doped semiconductor material across said light transmissive medium.

31. A laser according to claim 29 wherein said planar waveguide has an index of refraction which is controlled by said electrical input and wherein said electro-optically controlled optical element also comprises transparent conductors arranged adjacent said planar waveguide and electro-optically connected via electrodes to said electrical input, said transparent conductors being operative to apply electrical energy via suitably doped semiconductor material across said planar waveguide.

32. A laser according to claim 24 and wherein at least one of said diffraction grating and said planar waveguide are formed of an electro-optical material.

33. A laser according to claim 32 and wherein said electro-optically controlled optical element also comprises a light transmissive medium whose index of refraction is controlled by said electrical input and transparent conductors arranged adjacent said light transmissive medium and electro-optically connected via electrodes to said electrical input, said transparent conductors being operative to apply electrical energy across said light transmissive medium.

34. A laser according to claim 32 wherein said planar waveguide has an index of refraction which is controlled by said electrical input and wherein said electro-optically controlled optical element also comprises transparent conductors arranged adjacent said planar waveguide and electro-optically connected via electrodes to said electrical input, said transparent conductors being operative to apply electrical energy across said planar waveguide.

35. A laser according to claim 34 and wherein at least one of said diffraction grating and said planar waveguide are formed of at least one of a polymeric material and a liquid crystal.

36. A laser according to claim 35 and wherein said electro-optically controlled optical element also comprises a light transmissive medium whose index of refraction is controlled by said electrical input, and transparent conductors arranged adjacent said light transmissive medium and electro-optically connected via electrodes to said electrical input, said transparent conductors being operative to apply electrical energy across said light transmissive medium.

37. A laser according to claim 36 and wherein said light transmissive medium is a liquid crystal material.

38. A laser according to claim 37 and wherein said light transmissive medium has an index of refraction which is controlled by said electrical input and said optical element also comprises transparent conductors arranged adjacent said light transmissive medium and electro-optically connected via electrodes to said electrical input, said transparent conductors being operative to apply electrical energy across said light transmissive medium.

39. A laser according to claim 35 wherein said planar waveguide has an index of refraction which is controlled by said electrical input and wherein said electro-optically controlled optical element also comprises transparent conductors arranged adjacent said planar waveguide, and electro-optically connected via electrodes to said electrical input, said transparent conductors being operative to apply electrical energy across said planar waveguide.

40. A laser according to claim 24 and wherein said planar waveguide comprises multiple layers having differing indices of refraction.

41. A laser according to claim 24 and wherein said electro-optically controlled optical element also comprises at least one light transmissive surface generally parallel to said planar waveguide and comprising an anti-reflection coating formed on said at least one light transmissive surface.

42. A laser according to claim 24 and tunable by means of an electric input over a dynamic range of at least 0.1 nanometer.

43. A laser according to claim 24 and tunable by means of an electric input over a dynamic range of at least 1 nanometer.

44. A laser according to claim 24 and tunable by means of an electric input over a dynamic range of several tens of nanometers.

* * * * *

UNITED STATES PATENT AND TRADEMARK OFFICE
CERTIFICATE OF CORRECTION

PATENT NO.    : 6,215,928 B1
DATED         : April 10, 2001
INVENTOR(S)   : Asher A. Friesem et al.

Page 1 of 1

It is certified that error appears in the above-identified patent and that said Letters Patent is hereby corrected as shown below:

Title page,
Item [30] Foreign Application Priority Data, change "May 19, 1996" to
-- May 9, 1996 --

Signed and Sealed this

Twenty-ninth Day of January, 2002

*Attest:*

*Attesting Officer*

JAMES E. ROGAN
*Director of the United States Patent and Trademark Office*